US010419838B1

(12) United States Patent
Criswell et al.

(10) Patent No.: US 10,419,838 B1
(45) Date of Patent: Sep. 17, 2019

(54) HEADSET WITH PROXIMITY USER INTERFACE

(71) Applicant: Plantronics, Inc., Santa Cruz, CA (US)

(72) Inventors: Thomas G Criswell, Santa Cruz, CA (US); Eric Kiner, Felton, CA (US); Hua Zhao, Suzhou (CN); ShouBo Feng, Suzhou (CN)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 16/125,451

(22) Filed: Sep. 7, 2018

(51) Int. Cl.
*H03B 29/00* (2006.01)
*H04R 1/10* (2006.01)
*G10K 11/178* (2006.01)

(52) U.S. Cl.
CPC ..... *H04R 1/1041* (2013.01); *G10K 11/17823* (2018.01); *H04R 1/1016* (2013.01); *G10K 2210/1081* (2013.01); *G10K 2210/3044* (2013.01); *H04R 2420/07* (2013.01)

(58) Field of Classification Search
CPC ..... H03B 29/00
See application file for complete search history.

(56) References Cited

U.S. PATENT DOCUMENTS 7,010,332 B1* 3/2006 Irvin ..... H04M 1/05 455/575.2
9,838,812 B1* 12/2017 Shetye ..... H04R 29/001
9,900,680 B2* 2/2018 Milam ..... H04R 1/1041
10,019,964 B1* 7/2018 Patel ..... G09G 5/003
2007/0253584 A1* 11/2007 Rass ..... H04R 25/552 381/312
2009/0003641 A1* 1/2009 Van Der Bilt ..... H04R 1/1041 381/374
2009/0274317 A1* 11/2009 Kahn ..... H04M 1/6066 381/74
2011/0117840 A1* 5/2011 Li ..... H04M 1/0258 455/41.2
2013/0238340 A1* 9/2013 Walsh ..... G10L 13/04 704/260
2014/0229727 A1* 8/2014 Jun ..... G06F 9/4418 713/2
2017/0094392 A1 3/2017 Zorkendorfer et al.
2017/0155992 A1* 6/2017 Perianu ..... H04R 1/1016
2017/0214994 A1* 7/2017 Gadonniex ..... H04R 1/1016
2017/0223163 A1* 8/2017 Li ..... H04M 1/7253
2017/0374448 A1* 12/2017 Patel ..... H04R 1/1041
2018/0146307 A1* 5/2018 Petersen ..... H04R 25/552
2019/0028795 A1* 1/2019 Hirsch ..... H04R 1/1025

OTHER PUBLICATIONS

Suba, "QCY QY12 Bluetooth Earphones Review," found at URL <https://www.back2gaming.com/reviews/b2g-hardware/peripherals-review/hw-listening/gcy-qy12-bluetooth-earphones-review/>, Mar. 28, 2017, 13 pages.

* cited by examiner

*Primary Examiner* — Olisa Anwah
(74) *Attorney, Agent, or Firm* — Thomas S. Dienwiebel; Slayden Grubert Beard PLLC

(57) ABSTRACT

A headset with a proximity control is provided. The headset comprises at least a first earpiece, a second earpiece, and a control device. To reduce the power consumption of the headset, the control device is configured to determine proximity between the first earpiece and the second earpiece, and, depending on the determined proximity, to set the headset to a low-power mode, in which at least one component of the headset is disabled to save power.

12 Claims, 5 Drawing Sheets

HEADSET WITH PROXIMITY USER INTERFACE

FIELD

The present disclosure relates generally to the field of headphones and headsets.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Millions of wired and wireless headphones and headsets have been sold around the world. Wireless headphones and headsets pair with an audio host device, such as a computer, smartphone, or tablet, to enable untethered, hands-free communication and allow media consumption wherever convenient to the user. In particular in view of the more and more reduced size of headsets, battery run time has become a concern, in particular for "earbud"-type headsets or other comparably small types of headsets. Batteries are known to take up a substantial volume of such headsets and provide various limitations to designers of headsets for example with respect to size, weight, and aesthetics.

In some solutions, headsets with particularly small batteries have been marketed together with charging cases, so that a relatively short battery run time does not result in a reduced usability, since the user can easily charge the headset, even when "on the go".

However, doing so requires the user to carry the charging case and to remember to keep a sufficient charge in the charging case.

SUMMARY

As the present inventors have ascertained, prior art solutions may be cumbersome to the user, depending on the usage situation. Accordingly, a need exists for an improved headset.

The above problem is solved by a headset and a method of controlling a headset according to the independent claims. Embodiments are discussed in the dependent claims and the following description.

The invention proposes to allow operating the headset in a low-power mode when the headset is not in use, which may automatically be determined by considering the proximity of two earpieces of the headset. The present invention thus allows an improved battery run time by employing the low-power mode, while maintaining a high level of usability due to its automatic operation.

In one aspect of the present invention, a headset with a proximity control is provided that comprises at least a first earpiece; a second earpiece; and a control device. The control device is configured to determine proximity between the first earpiece and the second earpiece; wherein the control device is further configured to, depending on the determined proximity, set the headset to a low-power mode, in which at least one component of the headset is disabled to save power.

In another aspect of the invention, a headset with a proximity user interface is provided, comprising a first earpiece; a second earpiece; and a control device. Herein, the control device is configured to determine proximity between the first earpiece and the second earpiece; and wherein the control device is further configured to execute at least one user-configurable command depending on the determined proximity.

The details of one or more embodiments are set forth in the accompanying drawings and the following description. Other features and embodiments will be apparent from the description, drawings, and from the claims.

DETAILED DESCRIPTION

Figure 1:
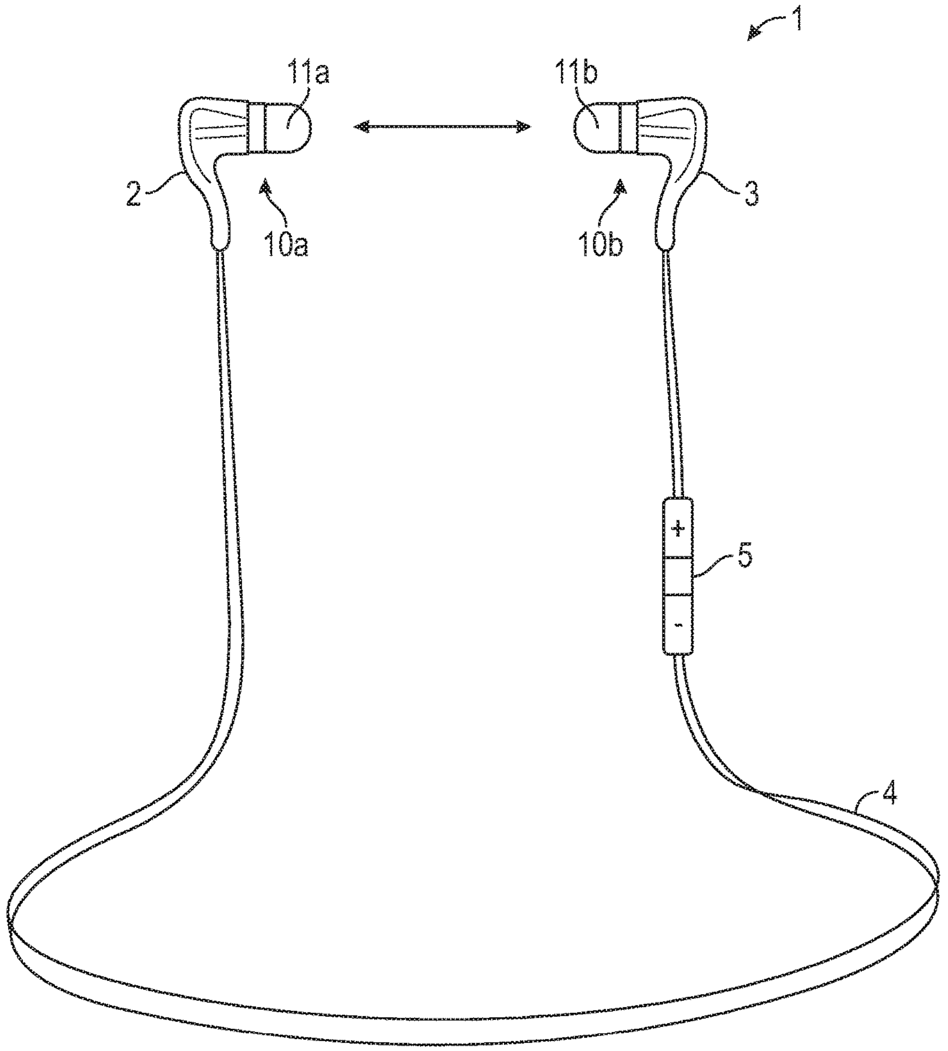
FIG. 1 shows a first embodiment of a headset with proximity control in a schematic perspective view.

Specific embodiments of the invention are described in detail herein. In the following description of embodiments of the invention, the specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

In the following explanation of the present invention according to the embodiments described, the terms "connected to" or "connected with" are primarily used to indicate a data and/or audio connection between at least two components, devices, units, or modules. Such a data and/or audio connection may be direct between the respective components, devices, units, or modules; or indirect, i.e., over intermediate components, devices, units, or modules. The connection may be permanent or temporary; wireless or conductor based.

For example, a data and/or audio connection may be provided over direct connection, a bus, or over a network connection, such as a WAN (wide area network), LAN (local area network), PAN (personal area network), BAN (body area network) comprising, e.g., the Internet, Ethernet networks, cellular networks, such as LTE, Bluetooth (classic, smart, or low energy) networks, DECT networks, ZigBee networks, and/or Wi-Fi networks using a corresponding suitable communications protocol. In some embodiments, a USB connection, a Bluetooth network connection and/or a DECT connection is used to transmit audio and/or data.

In the following description, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between like-named elements. For example, a first element is distinct from a second element, and the first element may encompass more than one element and succeed (or precede) the second element in an ordering of elements.

In one aspect, a headset with a proximity control is provided. The headset according to this aspect comprises at least a first earpiece, a second earpiece, and a control device. Certainly, the headset may in corresponding embodiments comprise additional components. According to the present aspect, the control device is configured to determine proximity between the first earpiece and the second earpiece. The control device is further configured to, depending on the determined proximity, set the headset to a low-power mode, in which at least one component of the headset is disabled to save power.

In the context of this application, the term "headset" refers to all types of headsets, headphones, and other head worn audio playback devices, such as for example circumaural and supra-aural headphones, ear buds, in ear headphones, and other types of earphones. The headset may be of mono, stereo, or multichannel setup. A dedicated microphone for recording the user's voice may or may not be provided as part of a headset in the context of this explanation. The headset in some embodiments may comprise an audio processor. The audio processor may be of any suitable type to at least provide output audio from an input audio signal. For example, the audio processor may be a digital sound processor (DSP).

As discussed in the preceding, the headset of this aspect comprises at least a first earpiece and a second earpiece. The earpieces may be of any suitable type to allow providing audio to a user during operation. Accordingly, the earpieces each may comprise at least one transducer and/or speaker for converting an audio signal to an acoustic signal that, during use, is provided to the user. Generally, an "earpiece" is configured to be arranged in contact with or in close proximity to a user's ear. The earpieces may be of wireless or wired type and certainly in corresponding embodiments may comprise further components. For example, in case the earpieces are of wireless type, each earpiece may comprise a receiver for receiving the audio signal and a battery to power its components. In case of wired type earpieces, the earpieces may for example comprise audio processing circuitry or user controls.

As discussed in the preceding, the earpieces may be of any suitable type. For example, the earpieces may be of circumaural or supra-aural type, may be earphones—also referred to as "earbuds"—, in-ear headphones, or mixed-fitting earphones.

The first and second earpieces may be arranged as part of the headset, so that the physical distance between them can be varied by the user. For example, and in case the earpieces are formed as wired or wireless earbuds, it will be apparent that the distance between the earbuds can be varied easily. However, also in case of exemplary circumaural or supra-aural earpieces that are connected, e.g., by a typical semi-rigid headband, it is possible to vary the distance between the earpieces by bending or providing hinge mechanisms to allow, e.g., folding. In both examples, varying the distance, i.e., changing the proximity between the earpieces is possible by user operation. The setup of the earpieces may be identical or different from each other in corresponding embodiments.

The control device of the headset, as discussed in the preceding, may be of any suitable type to control the functionality of the headset. In some embodiments, the control device comprises a microcontroller or a microprocessor, which provides the functionality described herein together with suitable programming, comprised in a memory, and/or together with dedicated circuitry. The memory may comprise one or more of flash memory, ROM, RAM, or a different type of solid state memory. Other types of memory are conceivable, although solid state or semiconductor memory is most commonly used today. In some embodiments, the control device may comprise an MCU with an integrated (Bluetooth) communications module.

As discussed in the preceding, the control device is configured to determine proximity between the first earpiece and the second earpiece and in dependence of the determined proximity, set the headset to the low-power mode. In this context, a determination of proximity entails at least a determination of whether the distance between the first and second earpieces meets a certain threshold. In other words, a determination, whether the distance between first and second earpieces is higher or lower than the defined proximity/distance threshold.

Certainly, various embodiments are conceivable. In some embodiments, the control device is configured to set the headset to the low-power mode in case the distance is below the threshold. For example, in case a user should bring the two earpieces close to or into physical contact, doing so may be taken as an indication that the headset currently is not in use and subsequently is set to the low-power mode.

In other embodiments, the headset is set to the low-power mode in case the distance is higher than the threshold. For example, a distance that is much higher than the typical distance between the human ears may also be taken as an indication that the headset currently is not in use.

In some embodiments, the threshold is set to substantially match the distance between a human's ears, i.e., somewhat smaller or somewhat higher than this distance.

It is noted that in some embodiments, the determination of proximity may comprise the determination of a distance/proximity value, i.e., a metric of the distance between the first and second earpieces. More details in this regard are discussed in the following.

As provided in the preceding, the control device of this aspect is configured to set the headset to a low-power mode in dependence of the determined proximity. In the low-power mode, one or more components of the headset are disabled to save power. In this context, the term "disabled" is understood as that at least part of the functionality of the respective component is set non-functional.

It is noted, that the low-power mode—also referred to as "sleep mode"—is different from a full "power off" of the headset in that the low-power mode allows a quick return to a fully operational mode. The low-power mode thus greatly enhances the user experience.

In some embodiments and in the low-power mode, at least one component of the headset is not switched off, i.e., remains powered to allow the quick return to the operational mode. In some embodiments, one or more high power consumption components are switched off in the low-power mode. For example, a number of high power consumption components may be switched off, so that the power consumption in the low-power mode is substantially lower than the power consumption in the operational mode.

The headset in further embodiments certainly may comprise additional components. For example, the headset in one exemplary embodiment may comprise one or more microphones, such as to obtain user audio from the user, additional control electronics to process audio, a wireless communications interface, a central processing unit, one or more housings, and/or one or more batteries.

In some embodiments, at least one of the first earpiece and the second earpiece comprises a magnetic sensor, connected to the control device to determine proximity between the first earpiece and the second earpiece. In some embodiments, the respective other of the first earpiece and the second earpiece comprises a magnetic element.

The magnetic sensor may be of any suitable type. In one example, the magnetic sensor may be a reed relay or reed switch. In further examples, the magnetic sensor may be an integrated circuit component that can be triggered by magnetic force. The magnetic element may be of any suitable type. For example, the magnetic element may be a permanent magnet or an electromagnet.

In some embodiments, the magnetic sensor is a hall effect sensor. As will be apparent to one of skill in the art, some types of hall effect sensors allow to determine a proximity metric, while reed switches and basic types of hall effect sensors typically allow for a binary determination, e.g., “proximate” vs. “non-proximate”.

In some embodiments, the control device is configured to determine a proximity value, corresponding to the proximity between the first earpiece and the second earpiece. In some embodiments, the control device is configured to compare the determined proximity value with a proximity threshold and to set the headset to the low-power mode in case the proximity value corresponds to the proximity threshold.

In the present embodiment, the proximity value may be a metric, relating to the distance between the first and second earpieces. The proximity value then is compared with the proximity threshold. One or more of the proximity value and the proximity threshold may be converted to allow the comparison in corresponding embodiments. The proximity threshold in some embodiments may be predefined, e.g., during manufacture of the headset. In some embodiments, the proximity threshold is user-definable, e.g., using a user interface of the headset or an application, running on an associated computing device.

In the present context, the term “corresponds to the proximity threshold” may comprise the logical states of “corresponding and lower than” as well as “corresponding and higher than”, depending on the respective application. In some embodiments, the control device is configured to set the headset to the low-power mode in case the proximity value corresponds to or is lower than the proximity threshold, e.g., when the distance between the two earpieces corresponds to or is lower than the distance threshold.

In some embodiments, the proximity threshold is user configurable. In further additional or alternative embodiments, the proximity threshold is predefined to a distance of 7.5 inches.

In some embodiments, the headset comprises a communications module for wireless connection to an audio device, wherein in said low-power mode, the connection to the audio device is disconnected. In view that wireless connections may use significant power, disconnecting from the audio device, or disabling the associated wireless interface, may be beneficial for battery run time. It is noted that an audio device may be configured to provide an audio signal to and/or obtain an audio signal from the headset. An audio device may also be referred to herein as an “audio gateway”.

The communications module may be of any suitable type and may be configured for communication with at least the audio device using any suitable communications protocol. For example, the communications module may be configured for communication according to GSM, LTE, Bluetooth (classic, smart, or low energy), DECT, ZigBee, and/or Wi-Fi standards.

In some embodiments, the headset comprises a noise cancellation circuit, wherein in said power-saving mode, the noise cancellation circuit is disabled to save power. Noise cancellation circuits and in particular so-called “active noise cancellation circuits” (ANC) may require significant operating power, so that disabling these types of circuits, if present, is beneficial to increase the battery run time.

In some embodiments, the control device is further configured to, in case the proximity value exceeds the proximity threshold after the proximity value corresponded to the proximity threshold, set the headset to an operational mode.

In some embodiments, the control device is further configured to, depending on the determined proximity, to set the headset to an operational mode. Accordingly and in this embodiment, the headset is configured for automatic “wake up” from the sleep mode, i.e., the re-enable the device in low-power mode to a fully functional mode.

In some embodiments, the control device is configured to set the headset to the operational mode when the proximity value does not correspond to the proximity threshold. For example, the control device may be programmed to re-enable the headset when the distance between the two earpieces is more than the distance/proximity threshold.

In some embodiments, the control device is further configured with a predefined power timeout period, so that, after the headset is in the low-power mode longer than the predefined power timeout period, the control device sets the headset to a powered-off mode. The present embodiment provides further power savings.

In some embodiments, the predefined power timeout period is user-configurable, e.g., using a correspondingly adapted user interface or by an application, provided on a connected computing device. Alternatively or additionally, the timeout period may be preset during manufacturing of the headset. For example, the timeout period may be set to 90 minutes.

In some embodiments, the control device is user-configurable, so that in case the headset is set to the low-power mode, one or more user-defined components of the headset are disabled. For example, a user may configure the control device to disable one or more of a communication module and a noise cancellation circuit.

In some embodiments, the first earpiece and the second earpiece are connected by a connection member. The connection member in the current embodiments may be a connection cable for allowing a galvanic connection with or without remote control, a headband, a neck band, or any other suitable mechanical connection.

In some embodiments, the headset comprises at least one user control interface, connected with the control device. The control interface in some embodiments may comprise one or more actuators, such as switches, buttons, dials, and touch interfaces to allow operating various functions of the headset. For example, an actuator may be provided to manually set the headset to the low-power more and/or to re-enable the headset when in low-power mode. In another alternative or additional example, an actuator may be provided enable from a powered-off mode.

In some embodiments, the user control interface may be user-configurable, e.g., using a corresponding setup application on a connected computing device, such as a laptop, smart phone, tablet, etc. In further embodiments, a priority between the user control actuator and a control by proximity is user-configurable.

According to another aspect, a method of proximity-controlling a headset, which headset comprises at least a first earpiece and a second earpiece, is provided, wherein a proximity between the first earpiece and the second earpiece is determined; and wherein, depending on the determined proximity, the headset is set to a low-power mode, in which at least one component of the headset is disabled to save power.

The headset according to the present aspect and in further embodiments may be configured according to one or more of the embodiments, discussed in the preceding with reference to the preceding aspect. With respect to the terms used for the description of the present aspect and their definitions, reference is made to the discussion of the preceding aspect.

According to another aspect, a headset with a proximity user interface is provided. The headset comprises a first earpiece, a second earpiece, and a control device. In this aspect, the control device is configured to determine proximity between the first earpiece and the second earpiece, and to execute at least one user-configurable command depending on the determined proximity.

The headset according to the present aspect and in further embodiments may be configured according to one or more of the embodiments, discussed in the preceding with reference to the preceding aspects. With respect to the terms used for the description of the present aspect and their definitions, reference is made to the discussion of the preceding aspects.

Reference will now be made to the drawings in which the various elements of embodiments will be given numerical designations and in which further embodiments will be discussed.

Specific references to components, process steps, and other elements are not intended to be limiting. Further, it is understood that like parts bear the same or similar reference numerals when referring to alternate figures. It is further noted that the figures are schematic and provided for guidance to the skilled reader and are not necessarily drawn to scale. Rather, the various drawing scales, aspect ratios, and numbers of components shown in the figures may be purposely distorted to make certain features or relationships easier to understand.

FIG. 1 shows a first embodiment of a headset 1 with proximity control in a schematic perspective view. The headset 1 comprises a first earpiece 2 and a second earpiece 3. As will be apparent from FIG. 1, the earpieces 2, 3 are formed as "earbuds" in this embodiment. Earpieces 2, 3 are connected by a cable connection member 4. The latter provides power and data connections between the earpieces 2, 3 and in particular power, audio, and control connections. Cable connection member 4 comprises a remote control 5 with a user control interface, allowing to power the headset 1 on and off, adjust the volume and answer and end calls. Remote control 5 further comprises a microphone (not shown) to record user audio, in particular to allow conducting phone calls.

Each earpiece 2, 3 comprises a speaker 10*a*, 10*b* to provide audio to a user during use. Replaceable eartips 11*a*, 11*b* allow to adapt the respective earpiece 2, 3 to the user's ear.

Figure 2:
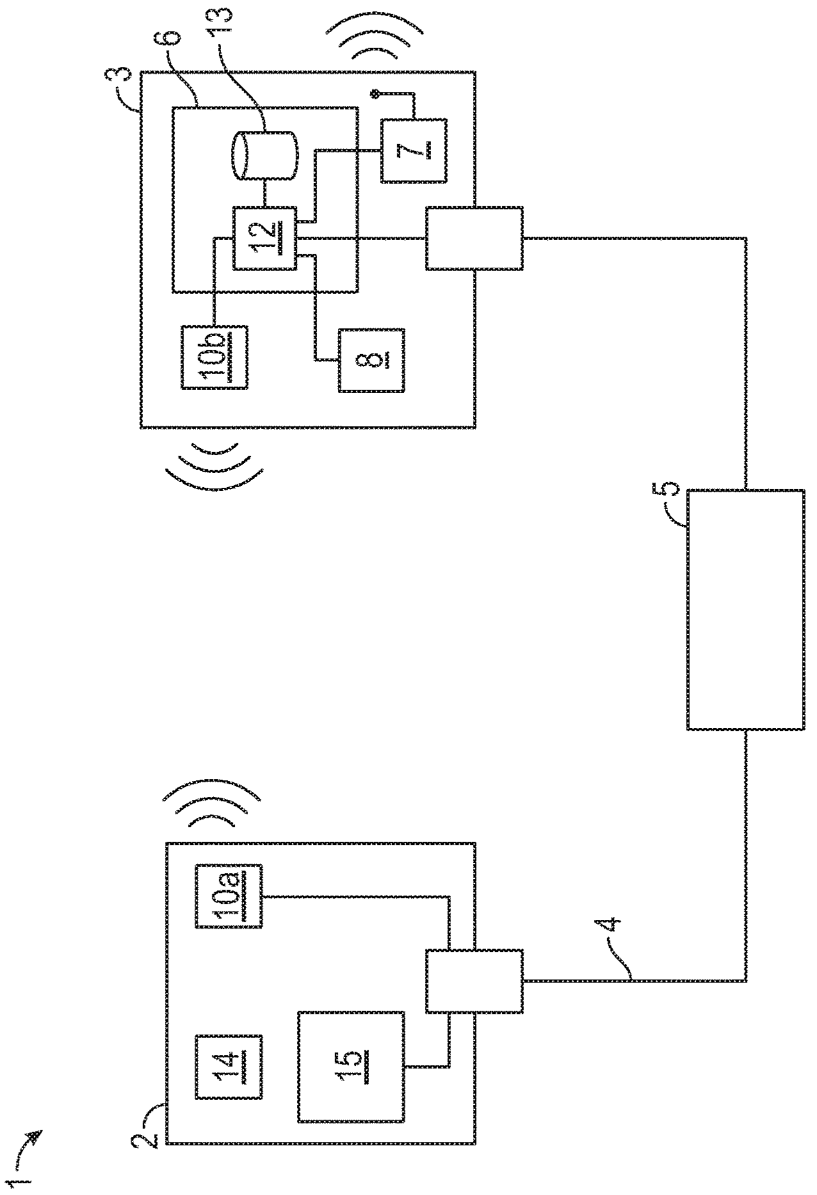
FIG. 2 shows a schematic block diagram of the embodiment of FIG. 1.

The first earpiece 2 further comprises a rechargeable battery 15 to power all components of headset 1 and a magnet 14, as can be seen from the schematic block diagram of FIG. 2. The magnet 14 allows a proximity detection, as discussed in the following, but also to attach the two earpieces 2, 3 to each other for a small form-factor during storage.

The second earpiece 3 comprises a control device 6 to control the functionality of the headset. The control device 6 comprises a microcontroller 12 and memory 13. The second earpiece 3 further comprises a wireless communications module 7 and a magnetic sensor 8. The magnetic sensor 8 allows to determine, whether the two earpieces 2, 3 are proximate to each other. The RF (radio frequency) communications module 7 allows communication with a computing device (not shown) using the Bluetooth protocol to receive and send audio signals. The respective computing device will in the following also be referred to as "audio device" or "audio gateway".

As discussed in the preceding, headset 1 is configured with a proximity control. More precisely, the control device 6 sets the headset 1 into a low-power mode upon determination that the two earpieces 2, 3 are only 0.5 cm apart or are closer. The earpieces 2, 3 being this close to each other is considered an indication that the user may be carrying the headset 1 in her or his pocket, but not actively using, i.e., wearing the headset 1.

To determine the proximity of the two earpieces 2, 3, the magnetic sensor 8 comprises a hall effect sensor. The hall effect sensor outputs a signal that is indicative of the magnetic field determined. Accordingly, when the first earpiece 2 with the magnet 14 is close to the second earpiece 3 and the magnetic sensor 8, the corresponding output signal of the hall effect sensor increases. Control device 6 is calibrated with a proximity threshold T, comprised in memory 13. The proximity threshold T in this embodiment corresponds to the output signal of the hall effect sensor, that corresponds to a distance of 5 cm between the two earpieces 2, 3. When the output signal is higher than the proximity threshold T, the headset is controlled to the low-power mode. Should the output signal of the hall effect sensor fall below the proximity threshold T, the headset is re-enabled and set to an operational mode.

Figure 3A:
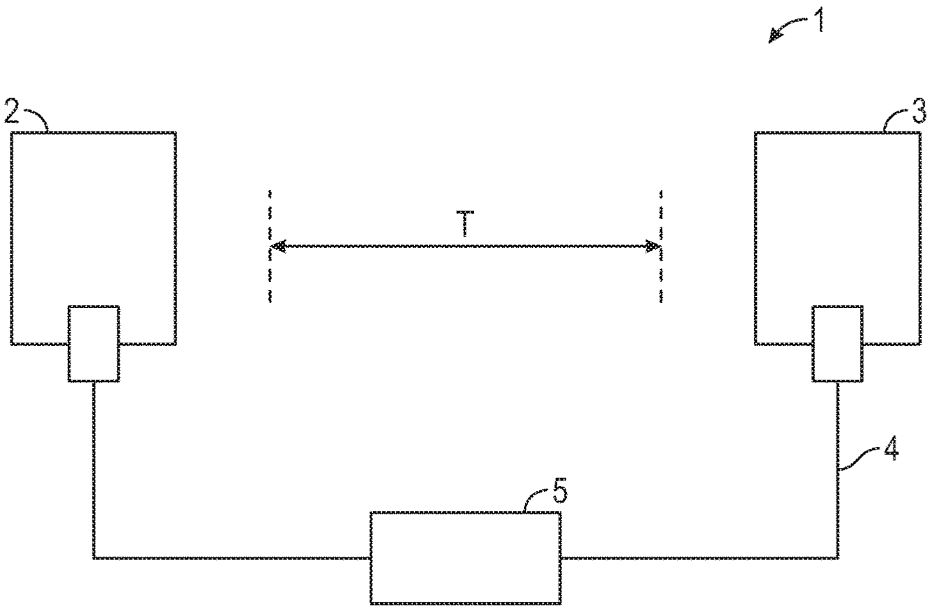
FIGS. 3A and 3B schematically show two operational modes of the headset of FIG. 1.
Figure 3B:
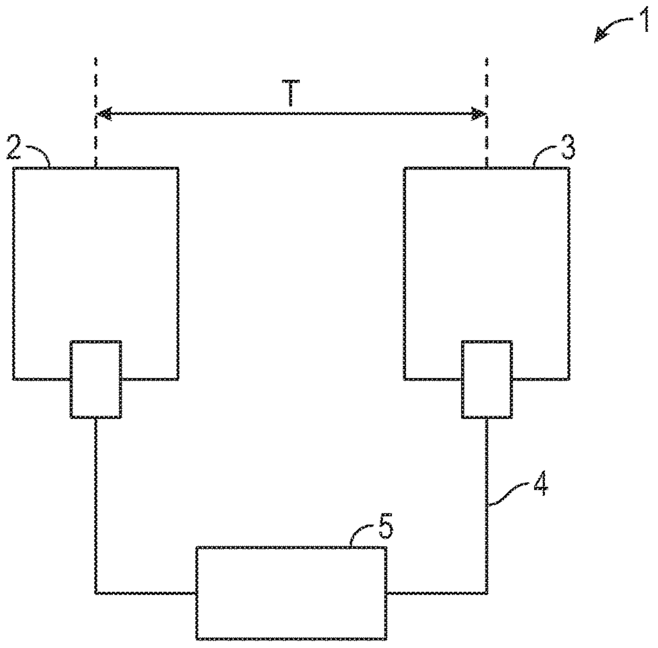

FIGS. 3A and 3B schematically show these two modes. FIG. 3A shows the headset 1 being in the operational mode in case the distance between the two earpieces 2, 3 is higher than the proximity threshold T, while FIG. 3B shows the headset 1 being in the low-power mode in case the distance between the two earpieces 2, 3 is lower than the proximity threshold T.

Certainly, it is noted that the proximity threshold T does not necessarily have to correspond to a 5 cm distance. Rather, the distance may be smaller or higher, depending on the application.

In the low-power mode, the Bluetooth connection between the wireless communications module 7 and the respective audio gateway is disconnected. As will be apparent to one of skill in the art, disconnecting the respective radio link provides power savings, as typical radio links attribute to a rather substantial share of the power consumption in a wireless device. In some embodiments, the RF communications module 7 is disabled, which saves even more power.

Once the headset 1 is in low-power mode, control device 6 starts an internal timer, counting down a time period of 90 minutes. Once the counter time is elapsed, the control device 6 powers off the headset 1. Then, the user is only able to set the headset 1 again to the operational mode using a corresponding multi-function power control button S5 (see FIG. 5A) of remote control 5.

Figure 4:
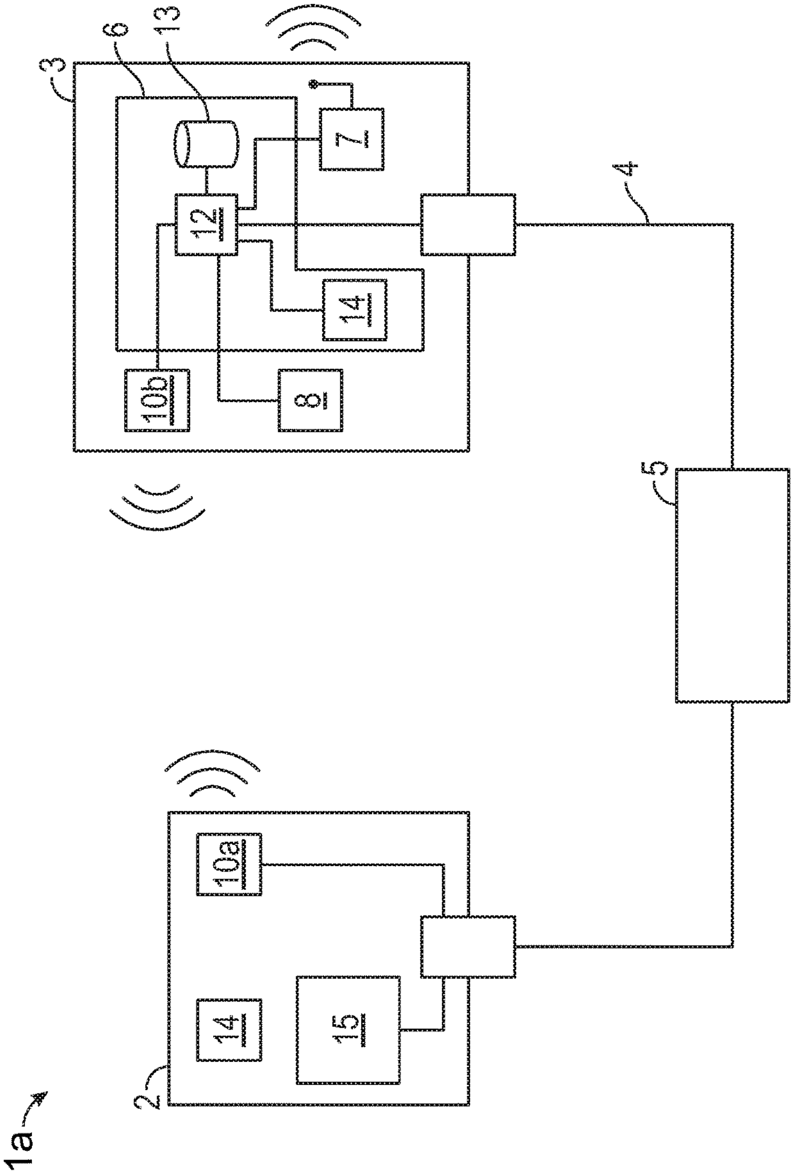

FIG. 4 shows a further embodiment of a headset 1*a* in a schematic block diagram. The current embodiment corresponds to the embodiment of headset 1 according to FIGS. 1 and 2 with the exception that the control device 6 comprises an active noise cancellation circuit 14 (ANC). The operation of ANC 14 corresponds to typical noise cancellation, namely the sampling of the environmental noise and providing a sound wave with the same amplitude but with inverted phase (also known as antiphase) using speakers 10*a* and 10*b*. The waves combine to form a new wave, in a process called interference, and effectively cancel each other out—an effect which is called destructive interference.

In light of the provision of ANC 14, the control device 6 in this embodiment is configured to power off ANC 14 in the low-power mode instead of or in addition to the disconnecting of the Bluetooth link to the audio gateway, as described in the preceding.

Figure 5A:
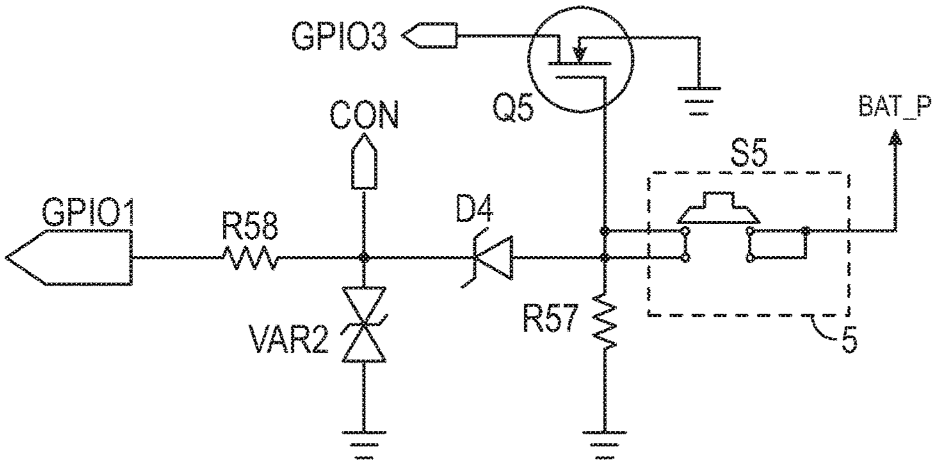
FIGS. 5A and 5B show partial circuit diagrams of control device 6 of the embodiment of FIG. 4.
Figure 5B:
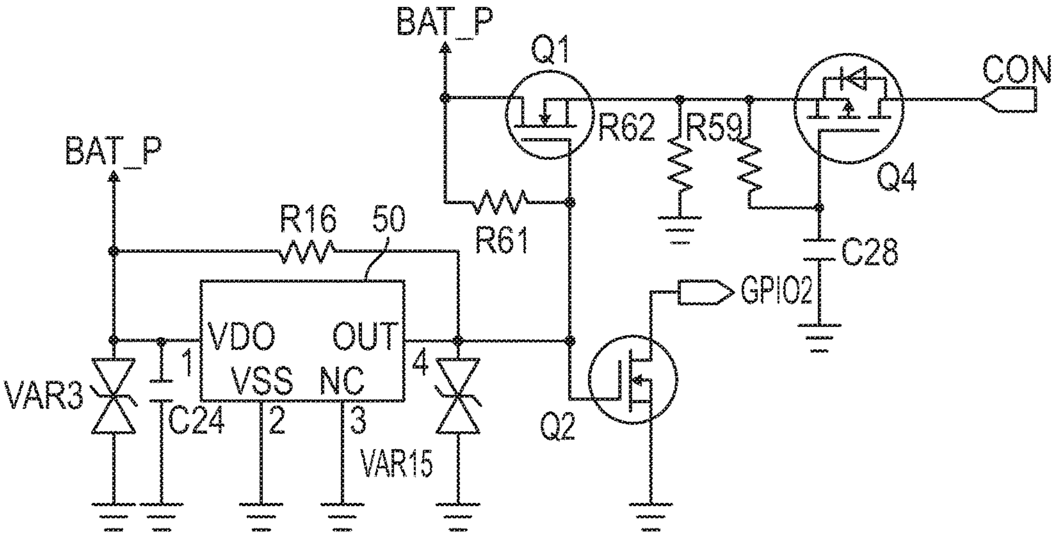

FIGS. 5A and 5B show partial circuit diagrams of control device 6 of the embodiment of FIG. 4. As can be seen from FIG. 5A, remote control 5 comprises a programmable multi-function power control button S5 connected over various circuit elements with general purpose GPIO1 and 3 pins of microcontroller 12. As discussed in the preceding, the button S5, e.g., allows to switch the headset 1*a* back on when powered off after the 90 minutes timeout. Button S5 also allows to power on headset 1*a* initially. When button S5 is actuated, both the states of GPIO1 and GPIO3 are changed, allowing for microcontroller 12 to determine the actuation of button S5.

FIG. 5B shows a further partial circuit diagram, connecting to the circuit diagram of FIG. 5A at the CON port. The circuit of FIG. 5B comprises the aforementioned hall effect sensor 50, which is connected over various circuit components with the CON port and the GPIO2 pin of microcontroller 12. When the hall effect sensor 50 is determining the magnet 14, a corresponding signal is provided to the GPIO2 pin of microcontroller 12. Simultaneously, GPIO1 changes its state. Accordingly, the microcontroller 12 is able to distinguish, whether a "power event" occurred at button S5 or at the hall effect sensor 50.

The aforementioned setup allows a user to configure the behavior of the headset 1*a* via an application on the connected audio gateway, e.g., her or his smartphone, and in particular control the prioritization of the proximity control over the button S5 control. The following table comprises a corresponding prioritization scheme, showing an exemplary "Mode 1" and an exemplary "Mode 2". As can be seen from the table, in mode 1, the button S5 can control the status of headset 1*a*, while in mode 2, the button S5 is disabled when the earpieces 2, 3 are proximate, thus, corresponding to an operational mode, where the proximity control takes priority over the UI control using button S5.

| HS Status | Earbud (Proximate/ distant) | Action | Mode 1 | Mode 2 |
|---|---|---|---|---|
| Low-power mode | Proximate | Move to distant | Set operational, turn ANC on | Set operational, turn ANC on |
| Low-power mode | Proximate | Press MFB S5 | Set operational, turn ANC on | No change |
| Low-power mode | Distant | Move to proximate | No change | No change |
| Low-power mode | Distant | Press MFB S5 | Set operational, turn ANC on | Set operational, turn ANC on |
| Operational | Proximate | Move to distant | No change | No change |
| Operational | Proximate | Press MFB S5 | Set operational, turn ANC on | No change |
| Operational | Distant | Move to proximate | Set to low-power, turn ANC off | Set to low-power, turn ANC off |
| Operational | Distant | Press MFB S5 | Set to low-power, turn ANC off | Set to low-power, turn ANC off |

While the invention has been illustrated and described in detail in the drawings and foregoing description, such illustration and description are to be considered illustrative or exemplary and not restrictive; the invention is not limited to the disclosed embodiments. For example, it is possible to operate the invention in any of the preceding embodiments, wherein instead of the earpieces 2, 3 being formed as earbuds, the earpieces 2,3 being formed as supra-aural earphones, circumaural earphones, in-ear headphones, or mixed-fitting earphones;

instead of the magnetic sensor 8 comprising a hall effect sensor, the magnetic sensor 8 comprising a reed switch or reed relay;

the control device 6 is configured to allow the user via the audio gateway to configure the operation in the low-power mode, i.e., whether the radio link is disabled, the ANC 14 is switched-off and/or any other component of headset 1, la is disabled.

The invention has been described in the preceding with reference to various embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit may fulfill the functions of several items recited in the claims.

The mere fact that certain measures are recited in mutually different dependent claims or different embodiments does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. Headset with a proximity control, comprising at least a first earpiece;

a second earpiece;

a control device; and at least one user control interface, connected with the control device, wherein the control device is configured to determine proximity between the first earpiece and the second earpiece;

the control device is further configured to, depending on the determined proximity, set the headset to a low-power mode, in which at least one component of the headset is disabled to save power; and wherein a priority between the user control interface and a control by proximity is user-configurable.

2. The headset of claim 1, wherein one of the first earpiece and the second earpiece comprises a magnetic sensor, connected to the control device, and the respective other of the first earpiece and the second earpiece comprises a magnetic element to determine proximity between the first earpiece and the second earpiece.

3. The headset of claim 2, wherein the magnetic sensor is a hall effect sensor.

4. The headset of claim 1, wherein the control device is configured to determine a proximity value, corresponding to the proximity between the first earpiece and the second earpiece; and wherein the control device is further configured to compare the determined proximity value with a proximity threshold and to set the headset to the low-power mode in case the proximity value corresponds to the proximity threshold.

5. The headset of claim 1, further comprising a communications module for wireless connection to an audio device, wherein in said low-power mode, the connection to the audio device is disconnected.

6. The headset of claim 5, wherein the communications module is a Bluetooth communications module.

7. The headset of claim 1, further comprising a noise cancellation circuit, wherein in said low-power mode, the noise cancellation circuit is disabled.

8. The headset of claim 1, wherein the control device is further configured to, depending on the determined proximity, to set the headset to an operational mode.

9. The headset of claim 4, wherein the control device is further configured to, in case the proximity value exceeds the proximity threshold, set the headset to an operational mode.

10. The headset of claim 1, wherein the control device is further configured with a predefined power timeout period, so that, after the headset is in the low-power mode longer as the predefined power timeout period, the control device sets the headset to a powered-off mode.

11. The headset of claim 1, wherein the control device is user-configurable, so that in case the headset is set to the low-power mode, one or more user-defined components of the headset are disabled.

12. The headset of claim 1, wherein the first earpiece and the second earpiece are connected by a connection member.

* * * * *